United States Patent
Volkovich et al.

(10) Patent No.: US 11,532,566 B2
(45) Date of Patent: Dec. 20, 2022

(54) MISREGISTRATION TARGET HAVING DEVICE-SCALED FEATURES USEFUL IN MEASURING MISREGISTRATION OF SEMICONDUCTOR DEVICES

(71) Applicant: KLA CORPORATION, Milpitas, CA (US)

(72) Inventors: Roie Volkovich, Hadera (IL); Liran Yerushalmi, Zicron Yaacob (IL); Raviv Yohanan, Qiryat Motzkin (IL); Mark Ghinovker, Yoqneam Ilit (IL)

(73) Assignee: KLA CORPORATION, Milpitas, CA (US)

( * ) Notice: Subject to any disclaimer, the term of this patent is extended or adjusted under 35 U.S.C. 154(b) by 110 days.

(21) Appl. No.: 16/964,714

(22) PCT Filed: Jun. 25, 2020

(86) PCT No.: PCT/US2020/039475
§ 371 (c)(1),
(2) Date: Jul. 24, 2020

(87) PCT Pub. No.: WO2021/211154
PCT Pub. Date: Oct. 21, 2021

(65) Prior Publication Data
US 2022/0013468 A1 Jan. 13, 2022

Related U.S. Application Data

(60) Provisional application No. 63/010,096, filed on Apr. 15, 2020.

(51) Int. Cl.
*H01L 23/544* (2006.01)
*G01B 21/22* (2006.01)
*G03F 7/20* (2006.01)

(52) U.S. Cl.
CPC ............ *H01L 23/544* (2013.01); *G01B 21/22* (2013.01); *G03F 7/70633* (2013.01); *H01L 2223/54426* (2013.01)

(58) Field of Classification Search
CPC ......... H01L 23/544; H01L 2223/54426; G03F 7/70633
See application file for complete search history.

(56) References Cited

U.S. PATENT DOCUMENTS 7,230,705 B1   6/2007 Yang et al.
7,608,468 B1   10/2009 Ghinovker et al.
(Continued)

FOREIGN PATENT DOCUMENTS

EP       1570232 A1    9/2005
KR    20180058819 A    6/2018
(Continued)

OTHER PUBLICATIONS

Ausschnitt et al., "Multilayer overlay metrology," Proc. SPIE 6152, Metrology, Inspection, and Process Control for Microlithography XX, 615210, Mar. 24, 2006.
(Continued)

*Primary Examiner* — Phat X Cao
*Assistant Examiner* — Victor V Barzykin
(74) *Attorney, Agent, or Firm* — Hodgson Russ LLP

(57) ABSTRACT

A target and method for using the same in the measurement of misregistration between at least a first layer and a second layer formed on a wafer in the manufacture of functional semiconductor devices on the wafer, the functional semiconductor devices including functional device structures (FDSTs), the target including a plurality of measurement structures (MSTs), the plurality of MSTs being part of the first layer and the second layer and a plurality of device-like structures (DLSTs), the plurality of DLSTs being part of at
(Continued)

least one of the first layer and the second layer, the DLSTs sharing at least one characteristic with the FDSTs and the MSTs not sharing the at least one characteristic with the FDSTs.

19 Claims, 9 Drawing Sheets

(56) References Cited

U.S. PATENT DOCUMENTS

| | | |
|---|---|---|
| 7,804,994 B2 | 9/2010 | Adel et al. |
| 9,927,718 B2 | 3/2018 | Kandel et al. |
| 10,527,951 B2 | 1/2020 | Yohanan et al. |
| 2013/0342831 A1 | 12/2013 | Levinski et al. |
| 2016/0266505 A1* | 9/2016 | Amit .................. G03F 7/70633 |
| 2018/0188663 A1 | 7/2018 | Levinski et al. |
| 2019/0179231 A1 | 6/2019 | Laske et al. |
| 2019/0303519 A1* | 10/2019 | Vijay Kumar ........ G06F 30/331 |
| 2020/0057388 A1* | 2/2020 | Sun .................... G03F 7/70633 |

FOREIGN PATENT DOCUMENTS

| | | |
|---|---|---|
| WO | 2020159560 A1 | 8/2020 |
| WO | 2020167331 A1 | 8/2020 |

OTHER PUBLICATIONS

WIPO, International Search Report for PCT/US2020/039475, dated Jan. 15, 2021.

\* cited by examiner

MISREGISTRATION TARGET HAVING DEVICE-SCALED FEATURES USEFUL IN MEASURING MISREGISTRATION OF SEMICONDUCTOR DEVICES

REFERENCE TO RELATED APPLICATIONS

Reference is hereby made to U.S. Provisional Patent Application Ser. No. 63/010,096, filed Apr. 15, 2020 and entitled INDIE OVERLAY TARGETS FOR ACCURACY AND DEVICE CORRELATION, the disclosure of which is hereby incorporated by reference and priority of which is hereby claimed.

Reference is also made to the following patents and patent applications of the Applicant, which are related to the subject matter of the present application, the disclosures of which are hereby incorporated by reference:
U.S. Pat. No. 7,608,468 entitled APPARATUS AND METHODS FOR DETERMINING OVERLAY AND USES OF SAME;
U.S. Pat. No. 7,804,994 entitled OVERLAY METROLOGY AND CONTROL METHOD;
U.S. Pat. No. 9,927,718 entitled MULTI-LAYER OVERLAY METROLOGY TARGET AND COMPLIMENTARY OVERLAY METROLOGY MEASUREMENT SYSTEMS;
U.S. Pat. No. 10,527,951 entitled COMPOUND IMAGING METROLOGY TARGETS;
European Patent No. 1,570,232 entitled APPARATUS AND METHODS FOR DETECTING OVERLAY ERRORS USING SCATTEROMETRY;
PCT Patent Application No. PCT/US2019/026686, filed Apr. 10, 2019 and entitled MOIRÉ TARGET AND METHOD FOR USING THE SAME IN MEASURING MISREGISTRATION OF SEMICONDUCTOR DEVICES; and
PCT Application No. PCT/US2019/035282, filed Jun. 4, 2019 and entitled MISREGISTRATION MEASUREMENTS USING COMBINED OPTICAL AND ELECTRON BEAM TECHNOLOGY.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved methods and systems for measurement of misregistration in the manufacture of semiconductor devices.

There is thus provided in accordance with a preferred embodiment of the present invention a target for use in the measurement of misregistration between at least a first layer and a second layer formed on a wafer in the manufacture of functional semiconductor devices on the wafer, the functional semiconductor devices including functional device structures (FDSTs), the target including a plurality of measurement structures (MSTs), the plurality of MSTs being part of the first layer and the second layer and a plurality of device-like structures (DLSTs), the plurality of DLSTs being part of at least one of the first layer and the second layer, the DLSTs sharing at least one characteristic with the FDSTs and the MSTs not sharing the at least one characteristic with the FDSTs.

In accordance with a preferred embodiment of the present invention, the at least one characteristic includes at least one of a degree of magnitude of a typical smallest dimension, a shape and a degree of magnitude of packing density.

In an embodiment of the present invention, the DLSTs are formed on both of the first layer and the second layer. Preferably, the DLSTs are formed between the MSTs. In a preferred embodiment of the present invention, wherein a packing density of the DLSTs is greater than 0.5.

In accordance with a preferred embodiment of the present invention, the characteristic is a degree of magnitude of typical smallest dimension and wherein a ratio of a typical smallest dimension of the MSTs to a typical smallest dimension of the FDSTs is at least 1.7 and a ratio of a typical smallest dimension of the DLSTs to the typical smallest dimension of the FDSTs is between 0.5-1.5.

In accordance with a preferred embodiment of the present invention, the characteristic is a degree of magnitude of packing density and wherein the MSTs define measurement spaces (MSPs) formed therebetween, the FDSTs define functional device spaces (FDSPs) formed therebetween and the DLSTs define device-like spaces (DLSPs) therebetween and wherein a ratio of a typical smallest dimension of the MSPs to a typical smallest dimension of the FDSPs is at least 1.7 and a ratio of a typical smallest dimension of the DLSPs to the typical smallest dimension of the FDSPs is between 0.5-1.5.

In an embodiment of the present invention, the DLSTs are rotated relative to the MSTs in a plane generally parallel to a plane defined by the first layer.

In an embodiment of the present invention, each of the MSTs includes a plurality of segments and a plurality of corresponding segment spaces. Preferably, a ratio of a typical smallest dimension of the segments to a typical smallest dimension of the DLSTs is at least 1.1 and a ratio of a typical smallest dimension of spaces between the segments to a typical smallest dimension of spaces between the DLSPs is at least 1.1. In a preferred embodiment of the present invention, the DLSTs are rotated relative to the segments in a plane generally parallel to a plane defined by the first layer.

In accordance with a preferred embodiment of the present invention, the target is formed within a die of the wafer, the die including the functional semiconductor devices. Alternatively, in accordance with a preferred embodiment of the present invention, the target is formed in a scribe line of the wafer, the scribe line being generally free of the functional semiconductor devices.

In a preferred embodiment of the present invention, the MSTs are formed as part of at least one of an advanced imaging metrology in-die (AIMid) target, an advanced imaging metrology (AIM) target, a Box-in-Box (BiB) target, a blossom target, a Moiré target, a scatterometry target, an electron beam target, a hybrid scatterometry-electron beam target, a hybrid imaging-electron beam target and a target useful in the measurement of misregistration between three or more layers formed on the wafer.

There is also provided in accordance with another preferred embodiment of the present invention a method of measuring misregistration between at least one first layer and at least one second layer formed on a wafer in the manufacture of functional semiconductor devices, the functional semiconductor devices including functional device structures (FDSTs), the method including providing the wafer on which is formed a target including a plurality of measurement structures (MSTs), the plurality of MSTs being part of the first layer and the second layer and a plurality of device-like structures (DLSTs), the plurality of DLSTs being part of at least one of the first layer and the second layer and the DLSTs sharing at least one characteristic with the FDSTs and the MSTs not sharing the characteristic with the FDSTs measuring the target with a misregistration measurement tool, thereby generating an output signal and analyzing the output signal, thereby generating a misregistration value between the layers of the target.

Preferably, the MSTs are resolvable by the misregistration metrology tool and spaces between the MSTs are resolvable by the misregistration metrology tool. In an embodiment of the present invention, the DLSTs are not resolvable by the misregistration metrology tool and spaces between the DLSTs are not resolvable by the misregistration metrology tool.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

The targets of the present invention, described hereinbelow with reference to FIGS. 1-8, are preferably used in a system and method for measuring misregistration between different layers of semiconductor devices formed on a wafer and typically form part of a manufacturing process for semiconductor devices. The misregistration measured by the system and method described hereinbelow with reference to FIGS. 1-8 may be used to adjust portions of the manufacturing process for semiconductor devices, such as lithography, to ameliorate misregistration between various layers of the semiconductor devices being fabricated.

The targets described hereinbelow with reference to FIGS. 1-8 include measurement structures formed with at least two layers of a wafer, preferably during the formation of semiconductor devices on the wafer. The layers with which the target is formed may be mutually adjacent layers, but need not be, and may be separated by a height ranging from 50 nm to over 10 µm. Any material between a suitable misregistration tool radiation source and each of the layers is at least partially transparent to radiation generated by the radiation source.

Typically, a misregistration metrology tool measures the targets, described hereinbelow with reference to FIGS. 1-8, and returns a misregistration value for the target measured. The misregistration value for the target measured is assumed to be nearly identical to the misregistration of the semiconductor devices formed on the wafer on which the targets are formed. Thus, the misregistration value for the target is used to adjust fabrication tools used to form both the targets and the semiconductor devices, bringing the layers into closer registration.

Figure 1:
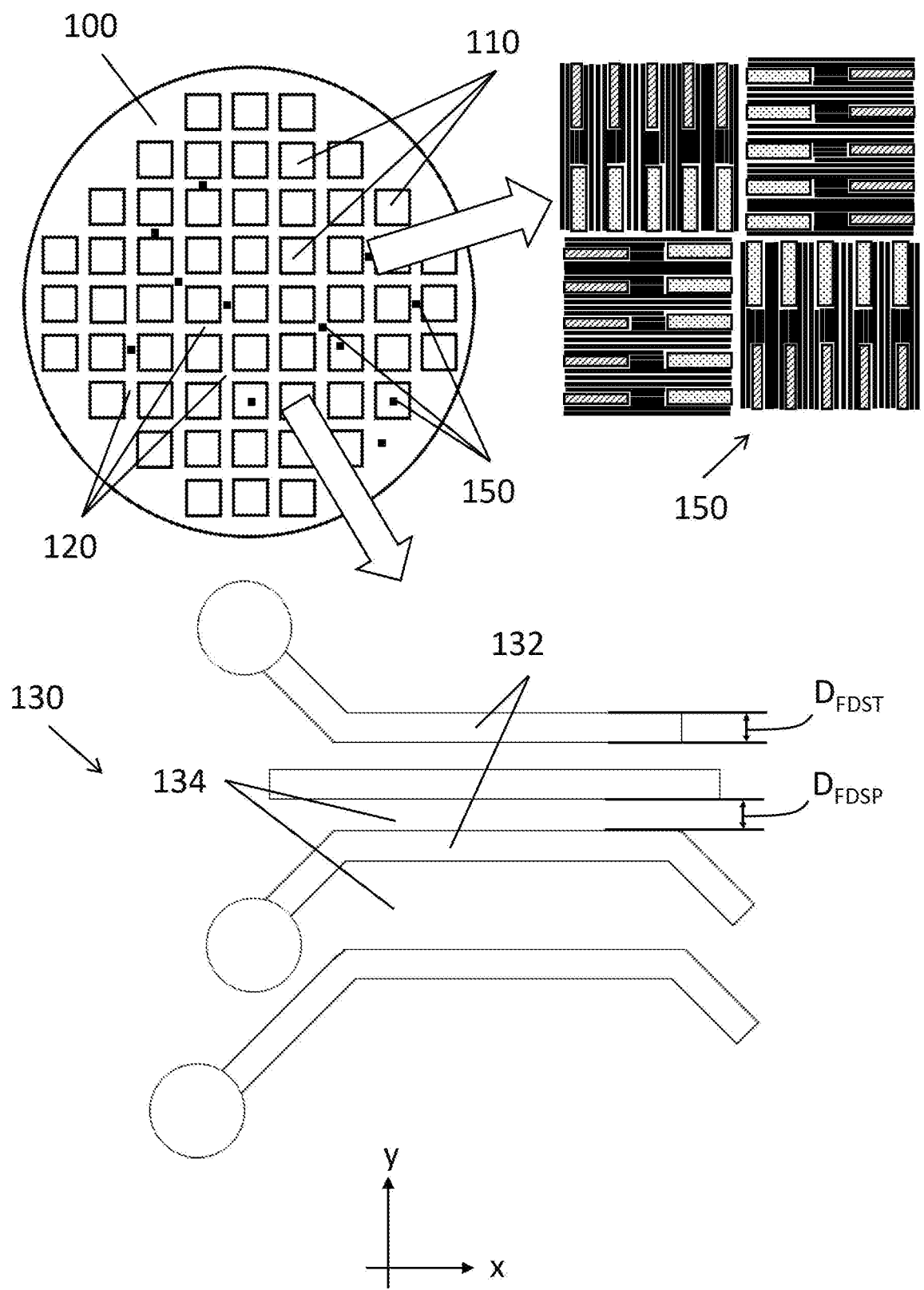
FIG. 1 is a simplified generally top planar illustration of a wafer including targets of the present invention.

Reference is now made to FIG. 1, which is a simplified generally top planar illustration of a wafer including targets of the present invention. It is appreciated that the generally planar surface shown in FIG. 1 defines an x-y plane, and that all dimensions described hereinbelow with reference to FIG. 1 are dimensions in a plane generally parallel to the x-y plane. It is further appreciated that FIG. 1 is not drawn to scale. It is further appreciated that in a preferred embodiment of the present invention, at least some features shown may be, and typically are, covered by other structures also formed on the wafer.

As seen particularly in FIG. 1, a wafer 100 is divided into a plurality of dies 110, which are separated by scribe lines 120. Typically, within dies 110 are formed full or partial functional semiconductor devices 130, such as, inter alia, transistors, trace lines, diodes and microelectromechanical systems (MEMS) devices. Functional semiconductor devices 130 are formed of functional device structures (FDSTs) 132. FDSTs 132 are characterized by a typical smallest FDST dimension, $D_{FDST}$, which is typically between 2 nm-200 nm, and more typically between 5 nm-80 nm. FDSTs 132 may be periodic, but need not be. Furthermore, FDSTs 132 have a typical FDST shape, such as, inter alia, a rectangle, a circle, a triangle, a cross, a square or a plurality of bars joined together at various angles.

FDSTs 132 preferably define a plurality of corresponding functional device spaces (FDSPs) 134. FDSPs 134 are characterized by a typical smallest FDSP dimension, $D_{FDSP}$, which is typically between 2 nm-200 nm, and more typically between 5 nm-80 nm.

Targets 150, which are described in detail hereinbelow with reference to FIGS. 2A-8, may be formed within either or both of dies 110, which include functional semiconductor devices 130, and scribe lines 120, which are generally free of functional semiconductor devices 130.

Reference is now made to FIGS. 2A-8, which are simplified generally top planar illustrations of various embodiments of targets 150. It is appreciated that the generally planar surfaces shown in FIGS. 2A-8 each define an x-y plane, and that all dimensions described hereinbelow with reference to FIGS. 2A-8 are dimensions in a plane generally parallel to the x-y plane. It is further appreciated that FIGS. 2A-8 are not drawn to scale. It is further appreciated that in a preferred embodiment of the present invention, at least some features shown may be, and typically are, covered by other structures also formed on the wafer.

Each of targets 150 typically has an area between 2,500 µm²-10,000 µm². As seen in FIGS. 2A-8, each of targets 150 preferably include a plurality of measurement structures (MSTs) 202. MSTs 202 preferably define a plurality of corresponding measurement spaces (MSPs) 204.

MSTs 202 include a plurality of first MSTs 210, which are formed as part of a first layer 212 formed on wafer 100, and a plurality of second MSTs 220, which are formed as part of a second layer 222 formed on wafer 100. It is appreciated that first layer 212 defines a plane generally parallel to the x-y plane shown in FIGS. 2A-8. Each of MSTs 202 has a typical smallest MST dimension, $D_{MST}$. Preferably, typical smallest MST dimension $D_{MST}$ is between 10 nm-1800 nm. The value of typical smallest MST dimension $D_{MST}$ may be the same for each of MSTs 202 or different for each of MSTs 202. Preferably, plurality of first MSTs 210 all have the same typical smallest MST dimension $D_{MST}$ value and plurality of second MSTs 220 all have the same typical smallest MST dimension $D_{MST}$ value. If typical smallest MST dimension $D_{MST}$ is not the same for all MSTs 202, it is understood that the value of typical smallest MST dimension $D_{MST}$ as referenced in comparison to other dimensions, such as $D_{FDST}$, refers to an average value of typical smallest MST dimension $D_{MST}$.

In one embodiment of the present invention, MSTs 202 and FDSTs 132 are characterized by different degrees of magnitude of typical smallest dimension, which characterizes the size scale of the typical smallest dimension of a structure. In such an embodiment, a ratio of typical smallest MST dimension $D_{MST}$ to typical smallest FDST dimension, $D_{FDST}$, is preferably between 1.7-5, and more preferably between 2-4.5, and more preferably between 2.5-4 and yet more preferably between 3-3.5.

Furthermore, MSTs 202 have a typical MST shape, such as, inter alia, a rectangle, a circle, a triangle, a cross or a square. In one embodiment of the present invention, typical MST shape and typical FDST shape are different.

Similarly, MSPs 204 include a plurality of first MSPs 224, which form part of first layer 212 formed on wafer 100, and a plurality of second MSPs 226, which form part of second layer 222 formed on wafer 100. Each of MSPs 204 has a typical smallest MSP dimension, $D_{MST}$. Preferably, $D_{MST}$ is between 10 nm-1800 nm. The value of typical smallest MSP dimension $D_{MST}$ may be the same for each of MSPs 204 or different for each of MSTs 204. Preferably, plurality of first MSPs 224 all have the same typical smallest MSP dimension $D_{MST}$ value and plurality of second MSPs 226 all have the same typical smallest MSP dimension $D_{MST}$ value. If typical smallest MSP dimension $D_{MSP}$ is not the same for all MSPs 204, it is understood that the value of typical smallest MSP dimension $D_{MSP}$ as referenced in comparison to other dimensions, such as $D_{FDSP}$, refers to an average value of typical smallest MSP dimension $D_{MSP}$.

It is appreciated that typical smallest MST dimension $D_{MST}$ and typical smallest MSP dimension $D_{MST}$ together determine a packing density of MSTs 202, which characterizes how many MSTs 202 are formed within a given area. Similarly, typical smallest FDST dimension $D_{FDST}$ and typical smallest FDSP dimension $D_{FDSP}$ together determine a packing density of FDSTs 132, which characterizes how many FDSTs 132 are formed within a given area. Similarly, a degree of magnitude of packing density characterizes the size scale of the number of structures that are formed within a given area.

In one embodiment of the present invention, MSTs 202 and FDSTs 132 are characterized by different degrees of magnitude of packing density. In such an embodiment, a ratio of typical smallest MSP dimension $D_{MSP}$ to typical smallest FDSP dimension, $D_{FDSP}$, is preferably between 1.7-5, and more preferably between 2-4.5, and more preferably between 2.5-4 and yet more preferably between 3-3.5.

It is a particular feature of the present invention that within MSPs 204 are preferably formed a plurality of device-like structures (DLSTs) 230. In one embodiment of the present invention, as seen particularly in FIGS. 4 and 6, DLSTs 230 are formed within first MSPs 224 only. In another embodiment of the present invention, as seen particularly in FIG. 3, DLSTs 230 are formed within second MSPs 226 only. In yet another embodiment of the present invention, as seen particularly in FIGS. 2A, 5, 7 and 8, DLSTs 230 are formed in both of first MSPs 224 and second MSPs 226. It is appreciated that although particular embodiments of targets 150 are shown and described herein as including DLSTs 230 formed within a particular one or both of plurality of MSPs 224 and 226, any embodiment of target 150 described herein may be formed with DLSTs 230 formed within MSPs 224 only, within MSPs 226 only or within both of MSPs 224 and 226. It is appreciated that DLSTs 230 may be periodic, but need not be. It is additionally appreciated that DLSTs 230 formed within MSPs 224 need not be identical to DLSTs 230 formed within MSPs 226.

Each of DLSTs 230 has a typical smallest DLST dimension, $D_{DLST}$. Preferably, typical smallest DLST dimension $D_{DLST}$ is between 2 nm-200 nm, and more typically between 5 nm-80 nm. The value of typical smallest DLST dimension $D_{DLST}$ may be the same for each of DLSTs 230 or different for each of DLSTs 230. If typical smallest DLST dimension $D_{DLST}$ is not the same for all DLSTs 230, it is understood that the value of typical smallest DLST dimension $D_{DLST}$ as referenced in comparison to other dimensions, such as $D_{FDST}$, refers to an average value of typical smallest DLST dimension $D_{DLST}$.

In a preferred embodiment of the present invention, DLSTs 230 and FDSTs 132 are characterized by the same degree of magnitude of typical smallest dimension, which characterizes the size scale of the typical smallest dimension of a structure. In such an embodiment, a ratio of typical smallest DLST dimension $D_{DLST}$ to typical smallest FDST dimension, $D_{FDST}$, is preferably between 0.5-1.5, and more preferably between 0.6-1.4, and more preferably between 0.7-1.3, and more preferably between 0.8-1.2, and yet more preferably between 0.9-1.1.

Furthermore, DLSTs 230 have a typical DLST shape, such as, inter alia, a rectangle, a circle, a triangle, a cross or a square. In a preferred embodiment of the present invention, the typical DLST shape is particularly similar to the typical FDST shape. Thus, for example, if FDSTs 132 have a generally circular FDST shape, then in a preferred embodiment of the present invention, DLSTs 230 have a generally circular DLST shape. Similarly, if, for example, FDSTs 132 have an FDST shape that resembles a letter E, then in a preferred embodiment of the present invention, DLSTs 230 have a DLST shape that resembles a letter E.

Figure 3:
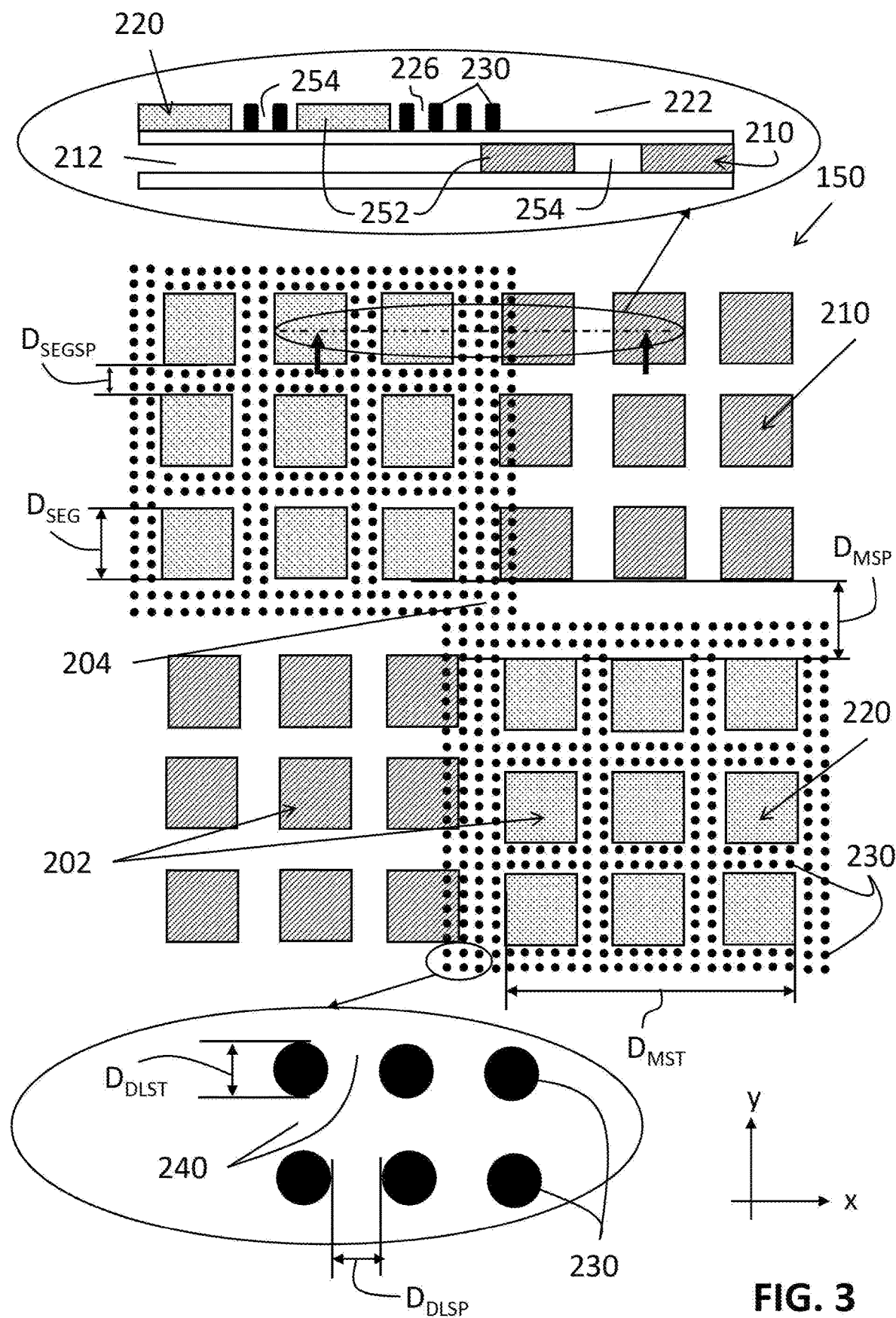
FIG. 3 is a simplified generally top planar illustration of an additional embodiment of a target of the present invention.
Figure 4:
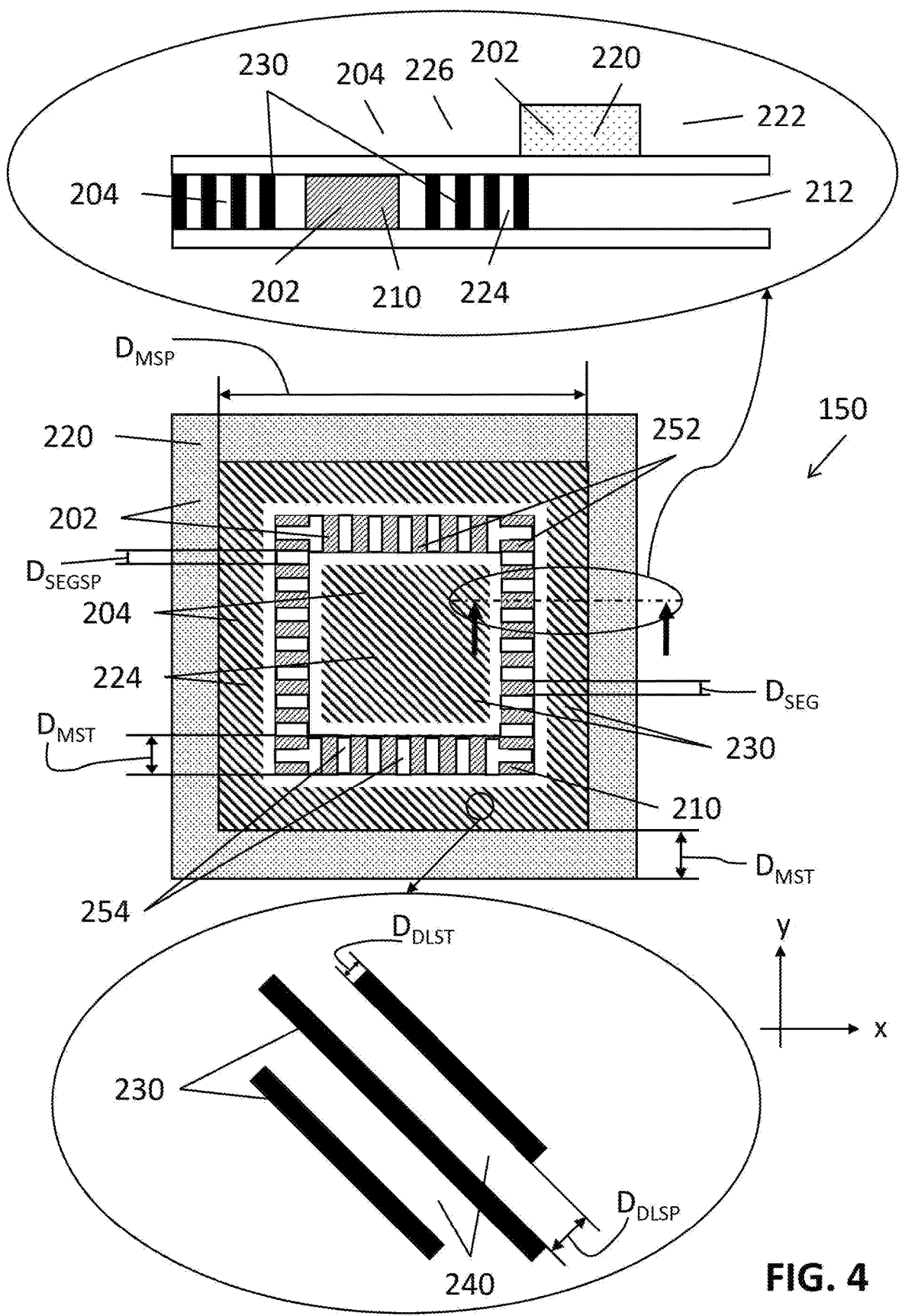
FIG. 4 is a simplified generally top planar illustration of another embodiment of a target of the present invention.
Figure 5:
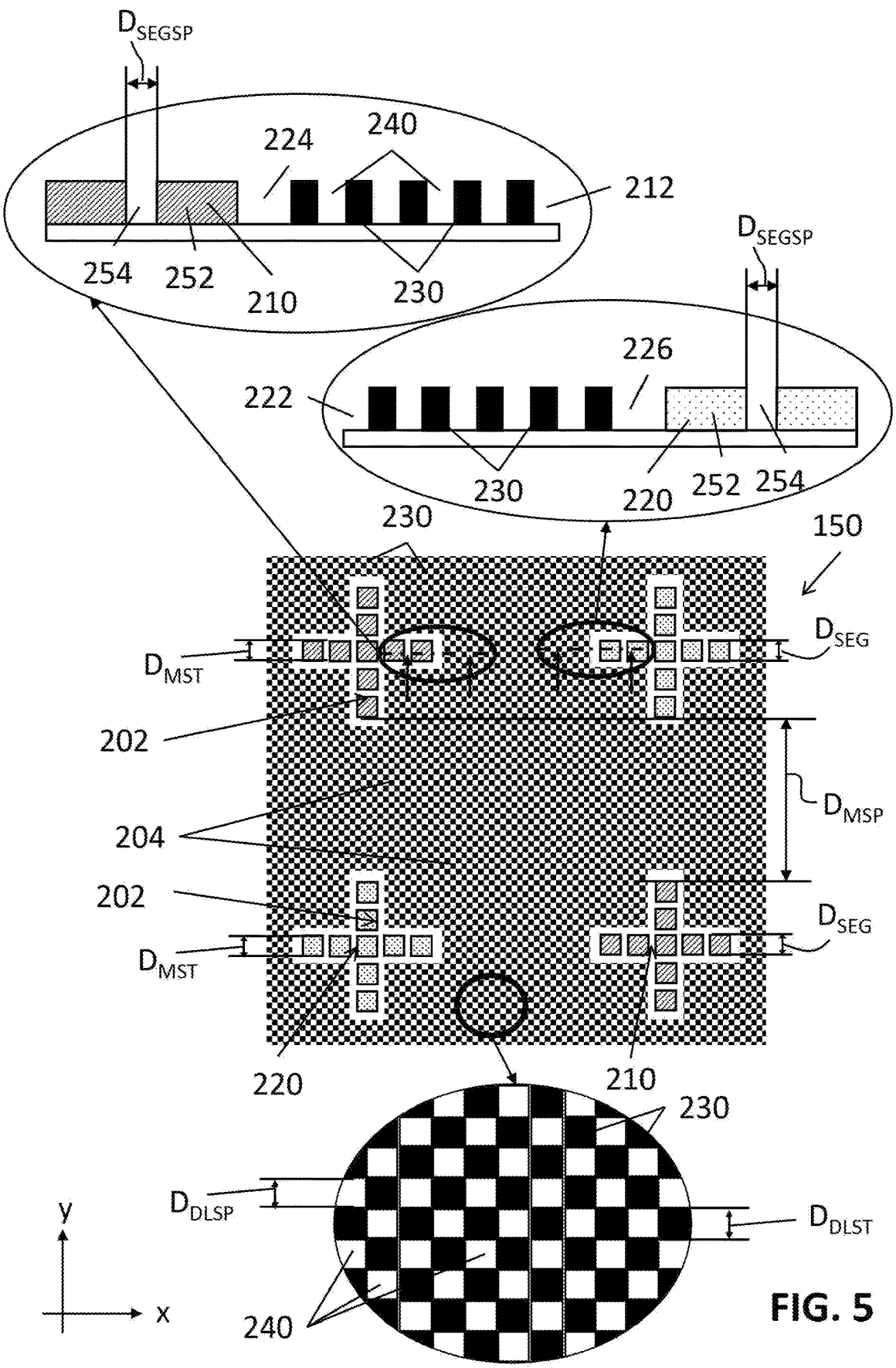
FIG. 5 is a simplified generally top planar illustration of a further embodiment of a target of the present invention.
Figure 6:
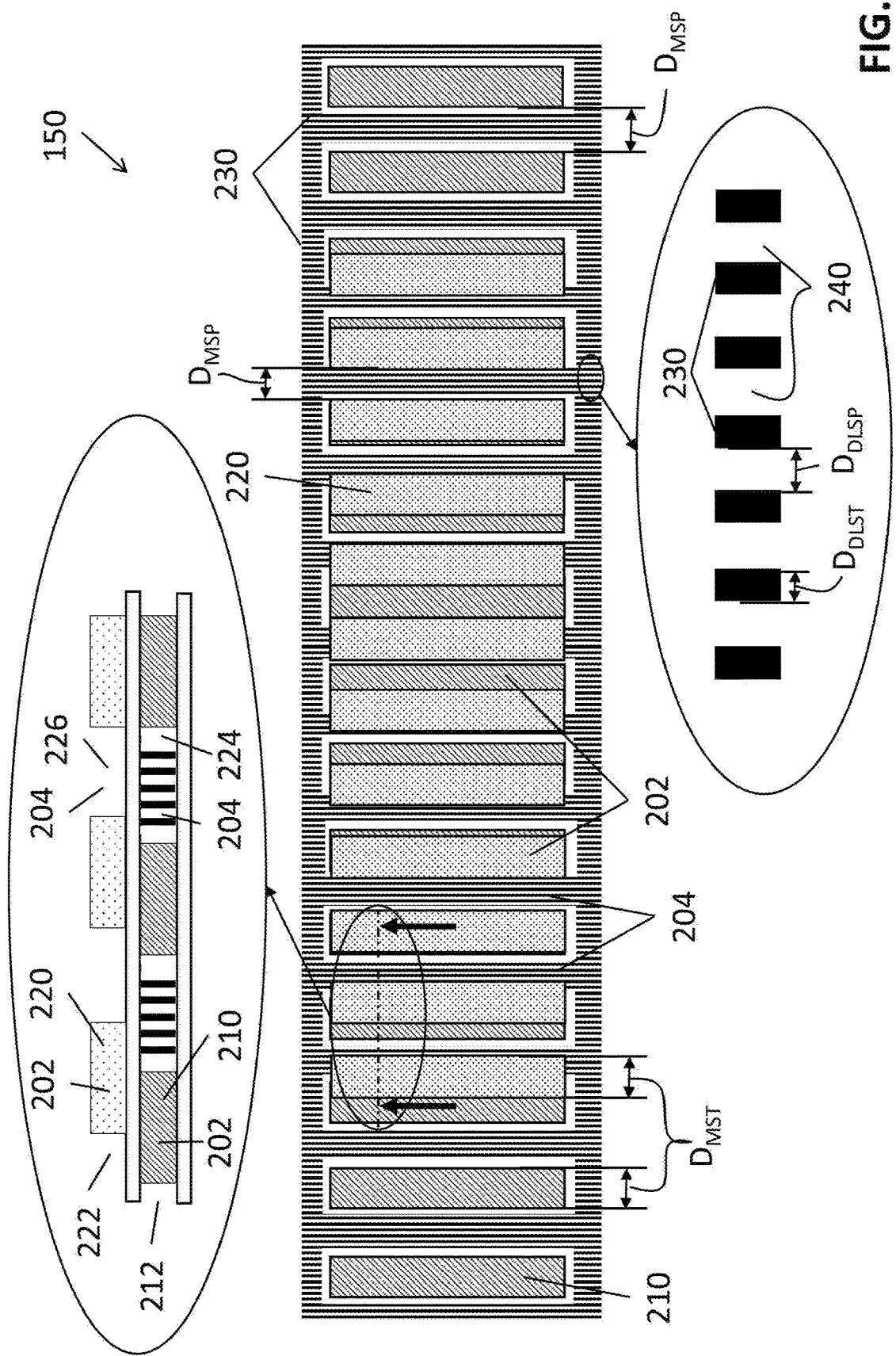
FIG. 6 is a simplified generally top planar illustration of yet an additional embodiment of a target of the present invention.
Figure 7:
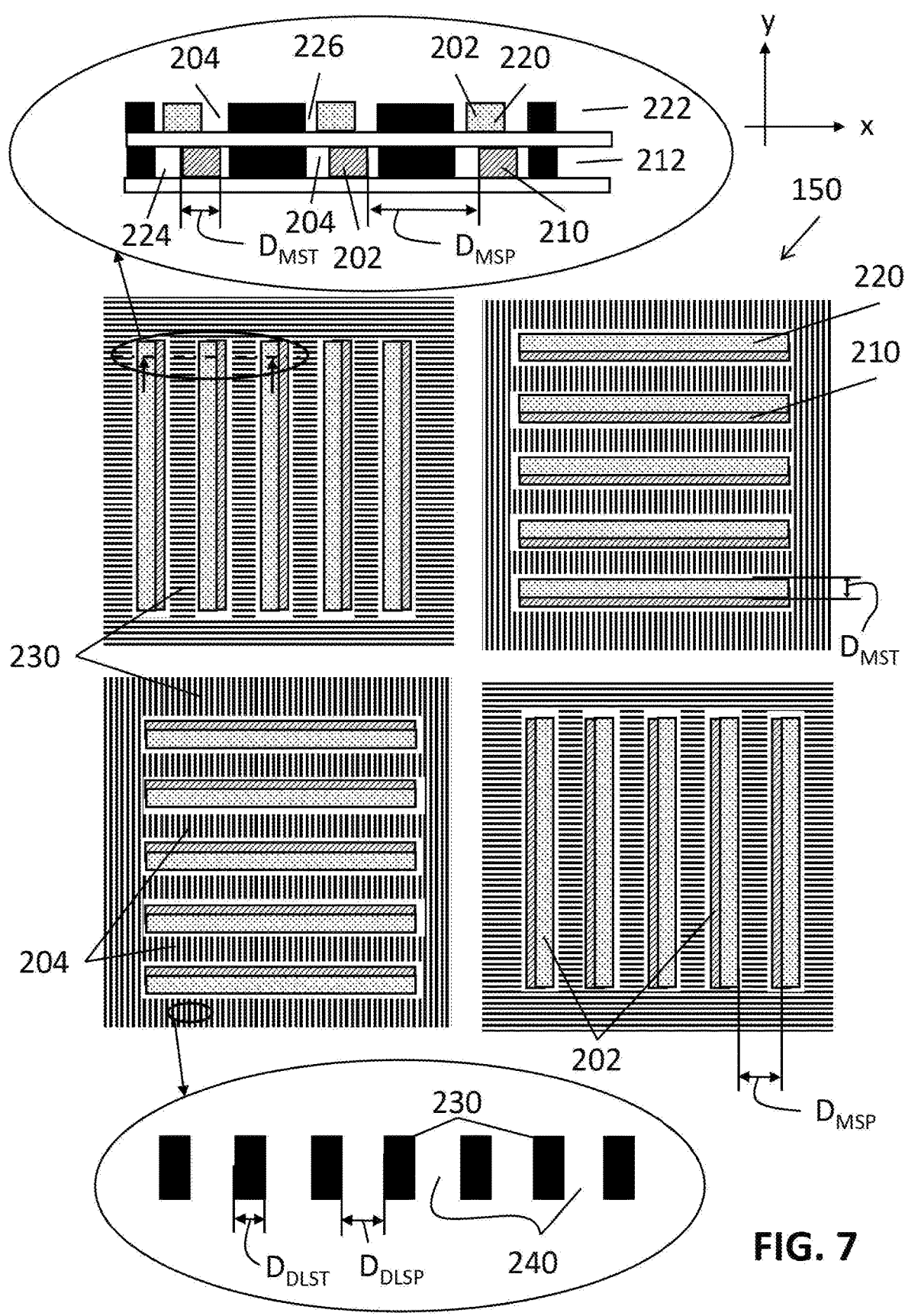
FIG. 7 is a simplified generally top planar illustration of yet another embodiment of a target of the present invention.

In a preferred embodiment of the present invention, as seen particularly in FIGS. 4 and 7, DLSTs 230 are rotated relative to MSTs 202 in a plane generally parallel to the plane defined by first layer 212. Thus, in such an embodiment, DLSTs 230 are rotated relative to MSTs 202 in the x-y plane shown in FIGS. 2A-8. It is appreciated that although only embodiments of targets 150 shown in FIGS. 4 and 7 are shown and described herein as including DLSTs 230 which are rotated relative to MSTs 202 in a plane generally parallel to the x-y plane, any embodiment of target 150 described herein may be formed with DLSTs 230 which are rotated relative to MSTs 202 in a plane generally parallel to the x-y plane. Similarly, any embodiment of target 150 described herein, including those embodiments shown in FIGS. 4 and 7, may be formed with DLSTs 230 which are not rotated relative to MSTs 202 in a plane generally parallel to the x-y plane.

DLSTs 230 preferably define a plurality of corresponding device-like spaces (DLSPs) 240. Each of DLSPs 240 has a typical smallest DLSP dimension $D_{DLSP}$. Preferably, typical smallest DLSP dimension $D_{DLSP}$ is between 2 nm-200 nm, and more typically between 5 nm-80 nm. The value of typical smallest DLSP dimension $D_{DLSP}$ may be the same for each of DLSPs 240 or different for each of DLSPs 240. If typical smallest DLST dimension $D_{DLSP}$ is not the same for all DLSPs 240, it is understood that the value of typical smallest DLSP dimension $D_{DLSP}$ as referenced in comparison to other dimensions, such as $D_{FDSP}$, refers to an average value of typical smallest DLSP dimension $D_{DLSP}$.

It is appreciated that typical smallest DLST dimension $D_{DLST}$ and typical smallest DLSP dimension $D_{DLSP}$ together determine a packing density of DLSTs 230, which characterizes how many DLSTs 230 are formed within a given area. Preferably, the packing density of DLSTs 230 is greater than 0.5.

In a preferred embodiment of the present invention, DLSTs 230 and FDSTs 132 are characterized by the same degree of magnitude of packing density. In such an embodiment, a ratio of typical smallest DLSP dimension $D_{DLSP}$ to typical smallest FDSP dimension, $D_{FDSP}$, is preferably between 0.5-1.5, and more preferably between 0.6-1.4, and more preferably between 0.7-1.3, and more preferably between 0.8-1.2, and yet more preferably between 0.9-1.1. Thus, the degree of magnitude of packing density of DLSTs 230 is generally the same as the degree of magnitude of packing density of FDSTs 132.

Figure 8:
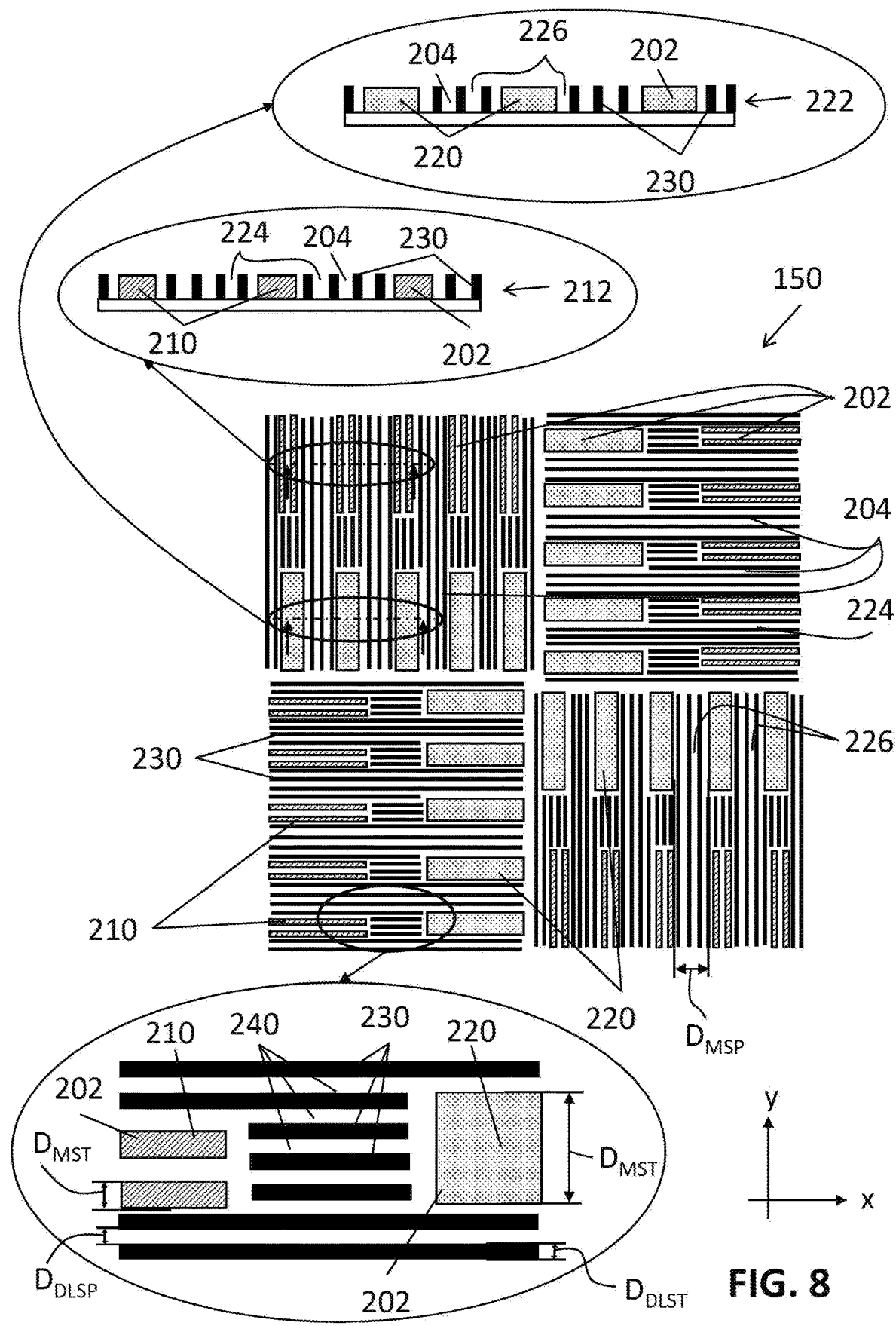
FIG. 8 is a simplified generally top planar illustration of a further embodiment of a target of the present invention.

In one embodiment of the present invention, as seen particularly in FIGS. 6, 7 and 8, each of MSTs 202 is a generally unitary element. In another embodiment of the present invention, as seen particularly in FIGS. 2B, 3 and 5, each of MSTs 202 is formed of a plurality of segments 252. Segments 252 preferably define a plurality of corresponding segment spaces 254. Furthermore, as seen particularly in FIG. 4, some of MSTs 202 may be generally unitary while other of MSTs 202 may be formed of segments 252. It is appreciated that although particular embodiments of targets 150 are shown and described herein as having unitary MSTs 202, particular embodiments of targets 150 are shown as and described herein as including segments 252 and a particular embodiment of target 150 is shown as including both unitary MSTs 202 and segments 252, any embodiment of target 150 described herein may be formed with unitary MSTs 202, segments 252, or a combination of unitary MSTs 202 and segments 252.

In some embodiments of the present invention, as seen particularly in FIG. 3, DLSTs 230 are formed in segment spaces 254.

Each of segments 252 has a typical smallest segment dimension, $D_{SEG}$. Preferably, typical smallest segment dimension $D_{SEG}$ is between 10 nm-300 nm, and more typically between 50 nm-100 nm. The value of typical smallest segment dimension $D_{SEG}$ may be the same for each of segments 252 or different for each of segments 252. If typical smallest segment dimension $D_{SEG}$ is not the same for all segments 252, it is understood that the value of typical smallest segment dimension $D_{SEG}$ as referenced in comparison to other dimensions, such as $D_{DLST}$, refers to an average value of typical smallest segment dimension $D_{SEG}$. Preferably, a ratio of typical smallest segment dimension $D_{SEG}$ to typical smallest DLST dimension, $D_{DLST}$, is at least 1.1, and more preferably at least 2.

Furthermore, segments 252 have a typical segment shape, such as, inter alia, a rectangle, a circle, a triangle, a cross or a square. In a preferred embodiment of the present invention, the typical segment shape is particularly different than the typical DLST shape. More particularly, in such a preferred embodiment of the present invention, a suitable misregistration tool used to measure target 150 can readily discern between the typical DLST shape and the typical segment shape. The suitable misregistration measurement tool, may be embodied as, for example, an Archer™ 750, an ATL™ 100 or an eDR7380™, all of which are commercially available from KLA Corporation of Milpitas, Calif., USA.

Thus, for example, if DLSTs 230 have a generally circular DLST shape, then in a preferred embodiment of the present invention, segments 252 preferably have a segment shape other than a circle, such as a square, as seen in FIG. 3. Similarly, if, for example, DLSTs 230 have a generally rectangular DLST shape, then in a preferred embodiment of the present invention, segments 252 have a segment shape that is not rectangular; for example, segments 252 may have a segment shape that is generally triangular.

In a preferred embodiment of the present invention, as seen particularly in FIG. 4, DLSTs 230 are rotated relative to segments 252 in a plane generally parallel to the plane defined by first layer 212. Thus, DLSTs 230 are rotated relative to segments 252 in a plane generally parallel to the x-y plane shown in FIGS. 2A-8. It is appreciated that although only the embodiment of target 150 shown in FIG. 4 is shown and described herein as including DLSTs 230 which are rotated relative to segments 252 in a plane generally parallel to the x-y plane, any embodiment of target 150 described herein may be formed with DLSTs 230 which are rotated relative to segments 252 in a plane generally parallel to the x-y plane. Similarly, any embodiment of target 150 described herein, including the embodiment shown in FIG. 4, may be formed with DLSTs 230 which are not rotated relative to segments 252 in a plane generally parallel to the x-y plane.

Preferably, each of segment spaces 254 has a typical smallest segment space dimension $D_{SEGSP}$. Preferably, typical smallest segment space dimension $D_{SEGSP}$ is between 10 nm-300 nm, and more typically between 50 nm-100 nm. The value of typical smallest segment space dimension $D_{SEGSP}$ may be the same for each of segment spaces 254 or different for each of segment spaces 254. If typical smallest segment space dimension $D_{SEGSP}$ is not the same for all segment spaces 254, it is understood that the value of typical smallest segment space dimension $D_{SEGSP}$ as referenced in comparison to other dimensions, such as $D_{DLSP}$, refers to an average value of typical smallest segment space dimension $D_{SEGSP}$. Preferably, a ratio of typical smallest segment space dimension $D_{SEGSP}$ to typical smallest DLSP dimension, $D_{DLSP}$, is at least 1.1, and more preferably at least 2.

In a preferred embodiment of the present invention, MSTs 202 and MSPs 204 are resolvable by the suitable misregistration measurement tool, while DLSTs 230, DLSPs 240, segments 252 and segment spaces 254 may not be resolvable by the suitable misregistration measurement tool. The suitable misregistration measurement tool, may be embodied as, for example, an Archer™ 750, an ATL™ 100 or an eDR7380™, all of which are commercially available from KLA Corporation of Milpitas, Calif., USA.

Target 150 is designed to be measured using the suitable misregistration measurement tool, thereby generating an output signal, and analyzing the output signal preferably generates a misregistration value between layers 212 and 214 of target 150. The misregistration value between layers 212 and 214 of target 150 is preferably used as a misregistration value between corresponding layers 212 and 214 of at least some of functional semiconductor devices 130, and is preferably used to adjust portions of the manufacturing process for functional semiconductor device 130, such as lithography, to ameliorate misregistration between layers 212 and 214.

Preferably, as compared to conventional targets, the inclusion of DLSTs 230 in target 150 improves the similarity of the physical misregistration between layers with which target 150 is formed and the physical misregistration between corresponding layers with which functional semiconductor devices 130 are formed. Furthermore, the inclusion of DLSTs 230 in target 150 preferably improves the accuracy of the misregistration value output upon the measurement thereof, as compared to conventional targets. Thus, the misregistration value measured between first layer 212 and second layer 214 of target 150 is particularly well-suited for use as the misregistration value between corresponding layers of functional semiconductor devices 130 and the adjustment thereof.

More particularly, the fabrication steps by which DLSTs 230 are formed are essentially identical to the fabrication steps by which FDSTs 132 are formed. Such fabrication steps may include, inter alia, etching, deposition, and planarization processes. Since target 150 and functional semiconductor devices 130 undergo essentially identical fabrication steps, including any processing errors included therein, the misregistration between layers with which target 150 is formed is particularly similar to the misregistration between corresponding layers with which functional semiconductor devices 130 are formed. Thus, the misregistration value measured between first layer 212 and second layer 214 of target 150 is particularly well-suited for use as the misregistration value between corresponding layers of functional semiconductor devices 130 and the adjustment thereof.

In a preferred embodiment of the present invention, multiple targets 150 are formed on wafer 100. In one embodiment of the present invention, some of targets 150 on a wafer, typically a design-of-experiment (DOE) wafer, are fabricated using parameters of a fabrication tool that intentionally vary from parameters of the fabrication tool used to fabricate other targets 150 on the DOE wafer. For example, some of targets 150 on the DOE differ from each other in at least one of typical smallest MST dimension $D_{MST}$, typical smallest MSP dimension $D_{MSP}$, typical smallest DLST dimension $D_{DLST}$, typical smallest DLSP dimension $D_{DLSP}$, typical smallest segment dimension $D_{SEG}$, typical smallest segment space dimension $D_{SEGSP}$, typical MST shape, typical DLST shape, typical segment shape, an MST orientation in a plane generally parallel to the x-y plane, a DLST orientation in a plane generally parallel to the x-y plane or a segment orientation in a plane generally parallel to the x-y plane. Thus, suitable measurement of misregistration between first layer 212 and second layer 214 of various targets 150 on the DOE wafer provides data correlated to fabrication process variations, and thus allows a user to better adjust the parameters of fabrication tools used to form the DOE wafer.

Additionally, it is appreciated that the inclusion of DLSTs 230 in target 150 generates misregistration data output that may vary in a meaningful manner as a function of measurement parameters used by the suitable misregistration measurement tool, such as wavelength of incident radiation. Thus, the misregistration value provided upon measuring misregistration between first layer 212 and second layer 214 of target 150 is particularly robust relative to the misregistration value provided upon measuring misregistration between layers of conventional targets, and is thus particularly well-suited for use as the actual misregistration value between corresponding layers of functional semiconductor devices 130 and the adjustment thereof.

Additionally, the inclusion of DLSTs 230 in target 150 preferably increases the manufacturing yield both of functional semiconductor devices 130 and targets 150 formed on wafer 100, as compared to the manufacturing yield of functional semiconductor devices 130 formed together with conventional targets. More particularly, the inclusion of DLSTs 230 in target 150 reduces mis-match between dimensions and pitches associated with target 150 and those associated with functional semiconductor devices 130. The reduced dimension and pitch mismatch improve complex fabrication design, such as optical proximity correction (OPC). Thus, functional semiconductor devices 130 and targets 150 formed on wafer 100 preferably both have an improved manufacturing yield as compared to the manufacturing yield of functional semiconductor devices 130 formed together with conventional targets.

Figure 2A:
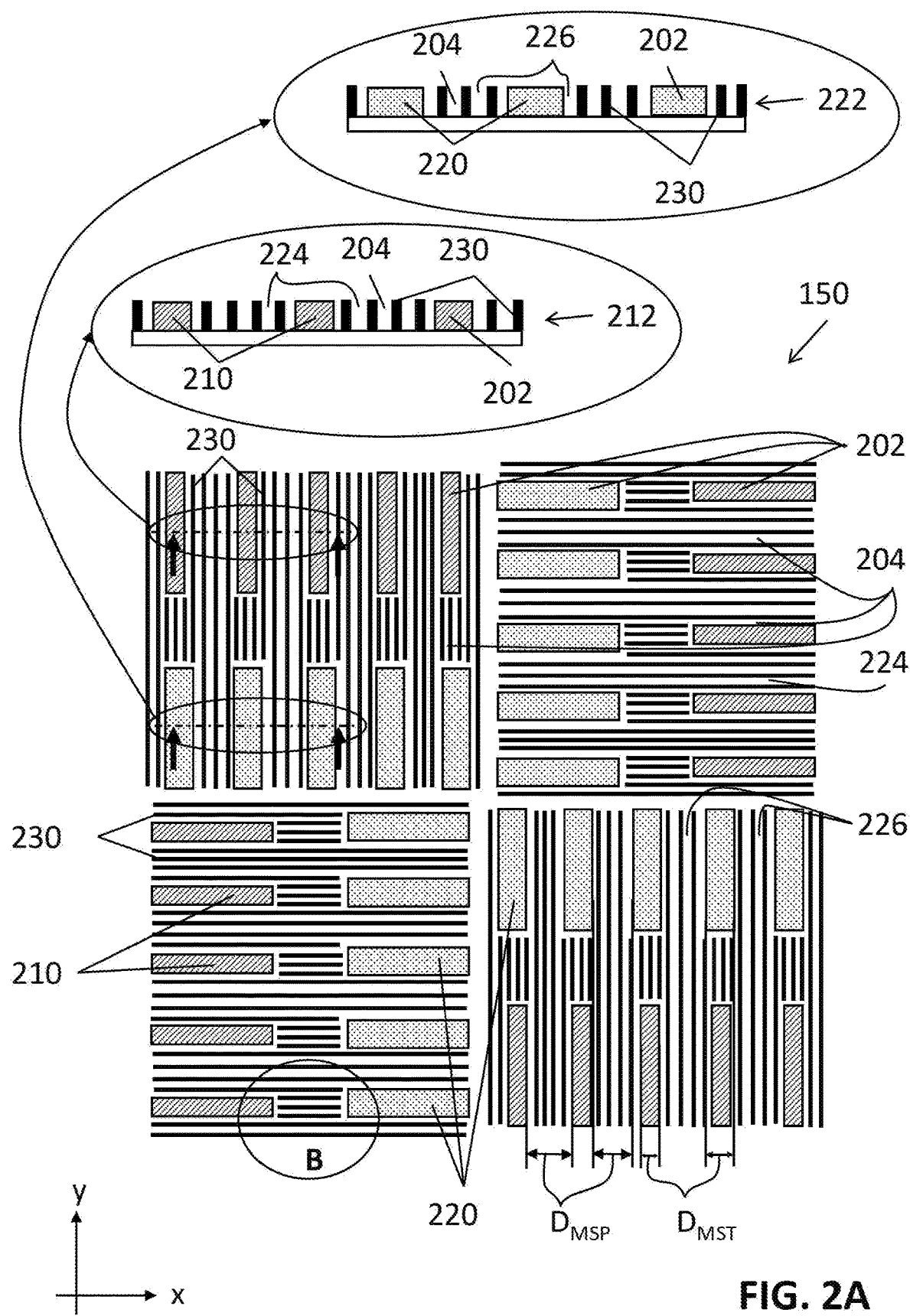
FIGS. 2A & 2B are respective simplified generally top planar and enlarged illustrations of an embodiment of a target of the present invention, FIG. 2B corresponding to area indicated by circle B in FIG. 2A.
Figure 2B:
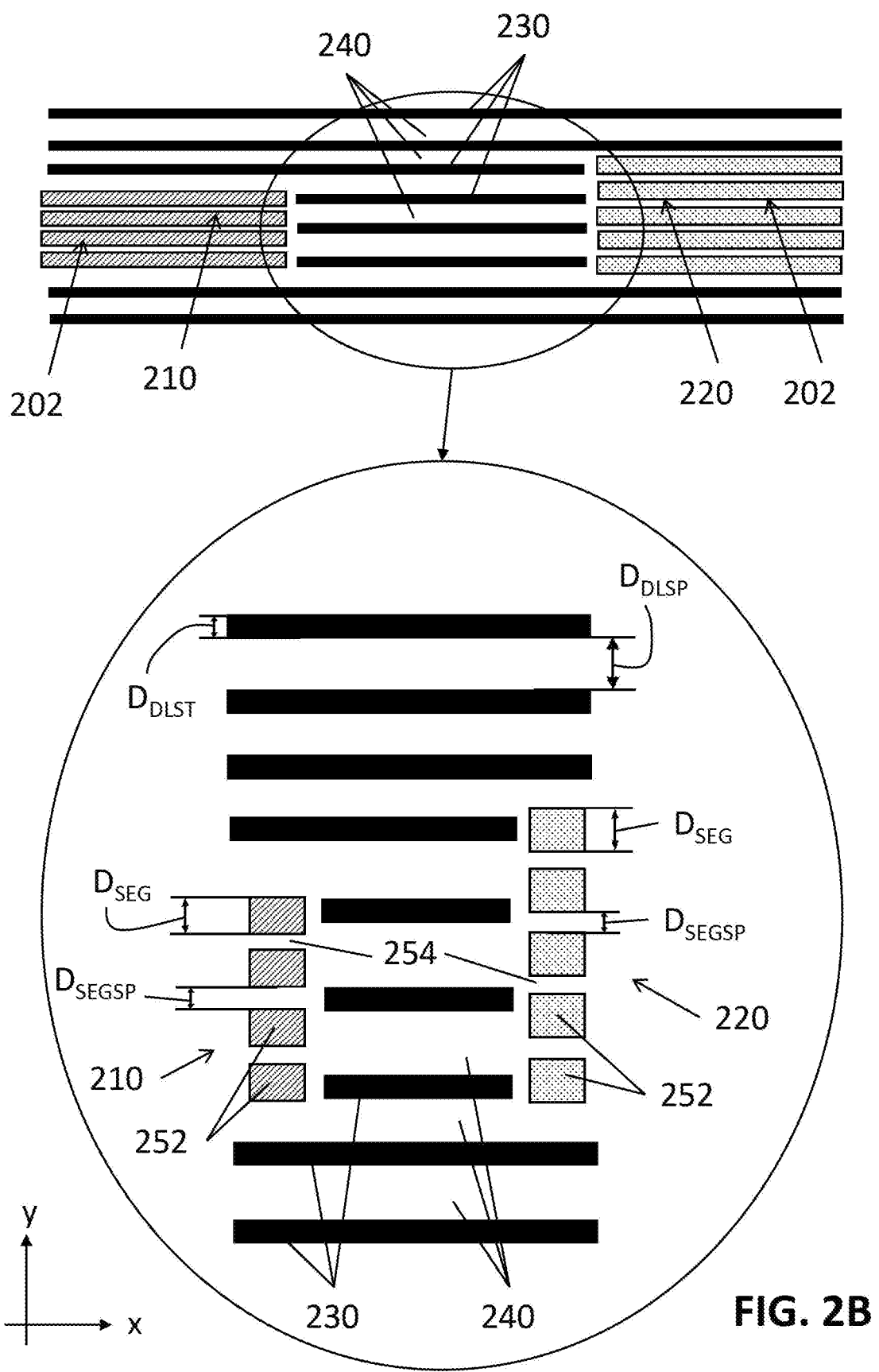

As seen particularly in FIGS. 2A & 2B, target 150 may be embodied as an advanced imaging metrology (AIM) target, which is similar to targets described in U.S. Pat. No. 10,527,951 and entitled COMPOUND IMAGING METROLOGY TARGETS. When target 150 is embodied as an AIM target, target features 202 together form an AIM target, and device-like features 230 are formed in spaces 214 and 224 typically present in such a conventional AIM target.

As seen particularly in FIG. 3, target 150 may be embodied as an AIM in-die (AIMid) target, which is similar to targets described in U.S. Pat. No. 10,527,951 and entitled COMPOUND IMAGING METROLOGY TARGETS. When target 150 is embodied as an AIMid target, target features 202 together form an AIMid target, and device-like features 230 are formed in spaces 214 and 224 typically present in such a conventional AIMid target.

As seen particularly in FIG. 4, target 150 may be embodied as a box-in-box (BiB) target, which is similar to targets described in U.S. Pat. No. 7,804,994 and entitled OVERLAY METROLOGY AND CONTROL METHOD. When target 150 is embodied as a BiB target, target features 202 together form a BiB target, and device-like features 230 are formed in spaces 214 and 224 typically present in such a conventional BiB target.

As seen particularly in FIG. 5, target 150 may be embodied as a blossom or a micro-blossom target, which is similar to targets described in C. P. Ausschnitt, J. Morningstar, W. Muth, J. Schneider, R. J. Yerdon, L. A. Binns, N. P. Smith, "Multilayer overlay metrology," Proc. SPIE 6152, Metrology, Inspection, and Process Control for Microlithography XX, 615210 (24 Mar. 2006). When target 150 is embodied as a blossom or a micro-blossom target, target features 202 together form a blossom or a micro-blossom target, and device-like features 230 are formed in spaces 214 and 224 typically present in such a conventional blossom or micro-blossom target.

As seen particularly in FIG. 6, target 150 may be embodied as a Moiré target, which is similar to targets described in PCT Patent Application No. PCT/US2019/026686, filed Apr. 10, 2019 and entitled MOIRÉ TARGET AND METHOD FOR USING THE SAME IN MEASURING MISREGISTRATION OF SEMICONDUCTOR DEVICES. When target 150 is embodied as a Moiré target, target features 202 together form a Moiré target, and device-like features 230 are formed in spaces 214 and 224 typically present in such a conventional Moiré target.

As seen particularly in FIG. 7, target 150 may be embodied as a scatterometry target, which is similar to targets described in European Patent No. 1,570,232, entitled APPARATUS AND METHODS FOR DETECTING OVERLAY ERRORS USING SCATTEROMETRY. When target 150 is embodied as a scatterometry target, target features 202 together form a scatterometry target, and device-like features 230 are formed in spaces 214 and 224 typically present in such a conventional scatterometry target.

As seen particularly in FIG. 8, target 150 may be embodied as an electron-beam target, which is similar to targets described in U.S. Pat. No. 7,608,468 entitled APPARATUS AND METHODS FOR DETERMINING OVERLAY AND USES OF SAME. When target 150 is embodied as an electron-beam target, target features 202 together form an electron-beam target, and device-like features 230 are formed in spaces 214 and 224 typically present in such a conventional electron-beam target.

It is appreciated that target 150 may additionally be embodied as a target other than those shown in FIGS. 2A-8. In such a case, target features 202 together form the target of the additional embodiment, and device-like features 230 are formed in spaces 214 and 224 typically present in such a conventional target as is used in the additional embodiment. Such a target may include, inter alia, a hybrid imaging-electron beam target and a hybrid scatterometry electron-beam target, similar to targets described in PCT Application No. PCT/US2019/035282, filed Jun. 4, 2019 and entitled MISREGISTRATION MEASUREMENTS USING COMBINED OPTICAL AND ELECTRON BEAM TECHNOLOGY, and a target useful in the measurement of misregistration between three or more layers formed on wafer 100, similar to targets described in U.S. Pat. No. 9,927,718 entitled MULTI-LAYER OVERLAY METROLOGY TARGET AND COMPLIMENTARY OVERLAY METROLOGY MEASUREMENT SYSTEMS.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A target for use in the measurement of misregistration between at least a first layer and a second layer formed on a wafer in the manufacture of functional semiconductor devices on the wafer, the functional semiconductor devices including functional device structures (FDSTs), the target comprising:
   a plurality of measurement structures (MSTs), said plurality of MSTs being part of said first layer and said second layer; and
   a plurality of device-like structures (DLSTs), said plurality of DLSTs being part of at least one of said first layer and said second layer,
   said DLSTs sharing at least one characteristic with said FDSTs; and
   said MSTs not sharing said at least one characteristic with said FDSTs,
   wherein said target is formed within a die of said wafer, said die comprising said functional semiconductor devices.

2. The target according to claim 1 and wherein said at least one characteristic includes at least one of:
   a degree of magnitude of a typical smallest dimension;
   a shape; and
   a degree of magnitude of packing density.

3. The target according to claim 1 and wherein said DLSTs are formed on both of said first layer and said second layer.

4. The target according to claim 1 and wherein said DLSTs are formed between said MSTs.

5. The target according to claim 1 and wherein a packing density of said DLSTs is greater than 0.5.

6. The target according to claim 1 and wherein said characteristic is a degree of magnitude of typical smallest dimension and wherein:
   a ratio of a typical smallest dimension of said MSTs to a typical smallest dimension of said FDSTs is at least 1.7; and
   a ratio of a typical smallest dimension of said DLSTs to said typical smallest dimension of said FDSTs is between 0.5-1.5.

7. The target according to claim 1 and wherein said characteristic is a degree of magnitude of packing density and wherein said MSTs define measurement spaces (MSPs) formed therebetween, said FDSTs define functional device spaces (FDSPs) formed therebetween and said DLSTs define device-like spaces (DLSPs) therebetween and wherein:
   a ratio of a typical smallest dimension of said MSPs to a typical smallest dimension of said FDSPs is at least 1.7; and
   a ratio of a typical smallest dimension of said DLSPs to said typical smallest dimension of said FDSPs is between 0.5-1.5.

8. The target according to claim 1 and wherein said DLSTs are rotated relative to said MSTs in a plane generally parallel to a plane defined by said first layer.

9. The target according to claim 1 and wherein each of said MSTs comprises:
   a plurality of segments; and
   a plurality of corresponding segment spaces.

10. The target according to claim 9 and wherein a ratio of a typical smallest dimension of said segments to a typical smallest dimension of said DLSTs is at least 1.1.

11. The target according to claim 9 and wherein a ratio of a typical smallest dimension of spaces between said segments to a typical smallest dimension of spaces between said DLSPs is at least 1.1.

12. The target according to claim 9 and wherein said DLSTs are rotated relative to said segments in a plane generally parallel to a plane defined by said first layer.

13. The target according to claim 1 and wherein another of said target is formed in a scribe line of said wafer, said scribe line being generally free of said functional semiconductor devices.

14. The target according to claim 1 and wherein said MSTs are formed as part of at least one of:
   an advanced imaging metrology in-die (AIMid) target;
   an advanced imaging metrology (AIM) target;
   a Box-in-Box (BiB) target;
   a blossom target;
   a Moiré target;
   a scatterometry target;
   an electron beam target;
   a hybrid scatterometry-electron beam target;
   a hybrid imaging-electron beam target; and
   a target useful in the measurement of misregistration between three or more layers formed on said wafer.

15. A method of measuring misregistration between at least one first layer and at least one second layer formed on a wafer in the manufacture of functional semiconductor devices, the functional semiconductor devices including functional device structures (FDSTs), the method comprising:
   providing said wafer on which is formed a target, wherein said target is formed within a die of said wafer, said die comprising said functional semiconductor devices, said target comprising:
      a plurality of measurement structures (MSTs), said plurality of MSTs being part of said first layer and said second layer; and
      a plurality of device-like structures (DLSTs), said plurality of DLSTs being part of at least one of said first layer and said second layer and said DLSTs sharing at least one characteristic with said FDSTs and said MSTs not sharing said characteristic with said FDSTs;
   measuring said target with a misregistration measurement tool, thereby generating an output signal; and
   analyzing said output signal, thereby generating a misregistration value between said layers of said target.

16. The method according to claim 15 and wherein said MSTs are resolvable by said misregistration metrology tool.

17. The method according to claim 15 and wherein spaces between said MSTs are resolvable by said misregistration metrology tool.

18. The method according to claim 15 and wherein said DLSTs are not resolvable by said misregistration metrology tool.

19. The method according to claim 15 and wherein spaces between said DLSTs are not resolvable by said misregistration metrology tool.

* * * * *